United States Patent
Kuo et al.

(10) Patent No.: US 10,804,138 B2
(45) Date of Patent: Oct. 13, 2020

(54) METHOD FOR FABRICATING A SEMICONDUCTOR DEVICE

(71) Applicant: UNITED MICROELECTRONICS CORP., Hsin-Chu (TW)

(72) Inventors: Chih-Wei Kuo, Tainan (TW);
Yu-Tsung Lai, Tainan (TW);
Jiunn-Hsiung Liao, Tainan (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 286 days.

(21) Appl. No.: 15/712,153

(22) Filed: Sep. 22, 2017

(65) Prior Publication Data
US 2019/0096748 A1  Mar. 28, 2019

(51) Int. Cl.
*H01L 21/768* (2006.01)

(52) U.S. Cl.
CPC ................... *H01L 21/768* (2013.01)

(58) Field of Classification Search
CPC ......... H01L 21/76805; H01L 21/76816; H01L 21/768–76807; H01L 21/7681–76813
See application file for complete search history.

(56) References Cited

U.S. PATENT DOCUMENTS

| | | | |
|---|---|---|---|
| 6,613,680 B2 * | 9/2003 | Tohda | H01L 21/31116 257/E21.252 |
| 7,442,637 B2 | 10/2008 | Su et al. | |
| 7,825,034 B2 | 11/2010 | Tsao et al. | |
| 9,608,126 B1 | 3/2017 | Hsu et al. | |
| 2006/0194426 A1 | 8/2006 | Yang et al. | |
| 2009/0087979 A1 | 4/2009 | Raghuram et al. | |
| 2015/0380303 A1 * | 12/2015 | Yang | H01L 21/76843 438/656 |
| 2017/0179020 A1 * | 6/2017 | Chang | H01L 21/31111 |
| 2018/0374744 A1 * | 12/2018 | Wu | H01L 21/76816 |

* cited by examiner

*Primary Examiner* — Stephen W Smoot
*Assistant Examiner* — Sun Mi Kim King
(74) *Attorney, Agent, or Firm* — Winston Hsu

(57) ABSTRACT

A method for fabricating a semiconductor device includes the steps of: providing a first dielectric layer having a metal layer therein; forming a second dielectric layer on the first dielectric layer and the metal layer; forming a metal oxide layer on the second dielectric layer; performing a first etching process by using a chlorine-based etchant to remove part of the metal oxide layer to forma via opening and expose the second dielectric layer; forming a block layer on sidewalls of the metal oxide layer and a top surface of the second dielectric layer; and performing a second etching process by using a fluorine-based etchant to remove part of the block layer and part of the second dielectric layer for exposing a top surface of the metal layer.

11 Claims, 3 Drawing Sheets

METHOD FOR FABRICATING A SEMICONDUCTOR DEVICE

BACKGROUND OF THE INVENTION

1. Field of the Invention

The invention relates to a method for fabricating semiconductor device, and more particularly, to a method for fabricating metal interconnections.

2. Description of the Prior Art

Integrated circuits have evolved into complex devices that can include millions of components (e.g., transistors, capacitors and resistors) on a single chip. The demand for greater circuit density necessitates a reduction in the dimensions of the integrated circuit components, e.g., sub-micron dimensions and the use of various materials to fabricate devices in order to achieve much faster and better electrical performance, such as materials with higher conductivity used in metal lines, materials with lower permittivity (low-k) dielectric constant used as insulating materials, etc. For integrated circuit fabrication, metal interconnects with low resistance, such as copper and aluminum interconnects, provide conductive paths between the integrate circuit components on integrated circuit devices. Generally, metal interconnects are electrically isolated from each other by a dielectric bulk insulating material. At sub-micron dimensions, capacitive coupling potentially occurs between adjacent metal interconnects, which may cause cross talk and/or resistance-capacitance (RC) delay and degrade the overall performance of the integrated circuit.

One method for forming vertical and horizontal interconnects for the integrated circuit components is by a damascene or dual damascene method. Typically, damascene structures have dielectric bulk insulating layers and conductive metal layers, such as low dielectric constant materials and conductive copper layers, stacked on top of one another. Vertical interconnects, i.e., vias, and horizontal interconnects, i.e., trenches are etched into the dielectric bulk insulating layer and the conductive metal layers are subsequently filled into the vias and/or trenches and planarized, such as by a chemical mechanical planarization process (CMP), so that the conducting metal materials are only left in the vias and/or trenches. In the damascene approach, a rather complex dielectric film stack that includes a sequence of hard mask, low-k dielectrics, and etch stop layers, etc., may be required. To obtain such a stack, via/trench lithography, patterning, and wet cleanings are typically required before filing the vias and the trenches with the conductive metal materials.

However, low-k materials as well as other dielectrics such as metal oxides are susceptible to various damages during subsequent processing steps, such as etching, wet-cleaning, pre-metal cleaning, or CMP etc. Hence there is a need for a process of making damascene structures with zero or minimized damages to the aforementioned materials in the dielectric film stack.

SUMMARY OF THE INVENTION

According to an embodiment of the present invention, a method for fabricating a semiconductor device includes the steps of: providing a first dielectric layer having a metal layer therein; forming a second dielectric layer on the first dielectric layer and the metal layer; forming a metal oxide layer on the second dielectric layer; performing a first etching process by using a chlorine-based etchant to remove part of the metal oxide layer to form a via opening and expose the second dielectric layer; forming a block layer on sidewalls of the metal oxide layer and a top surface of the second dielectric layer; and performing a second etching process by using a fluorine-based etchant to remove part of the block layer and part of the second dielectric layer for exposing a top surface of the metal layer.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
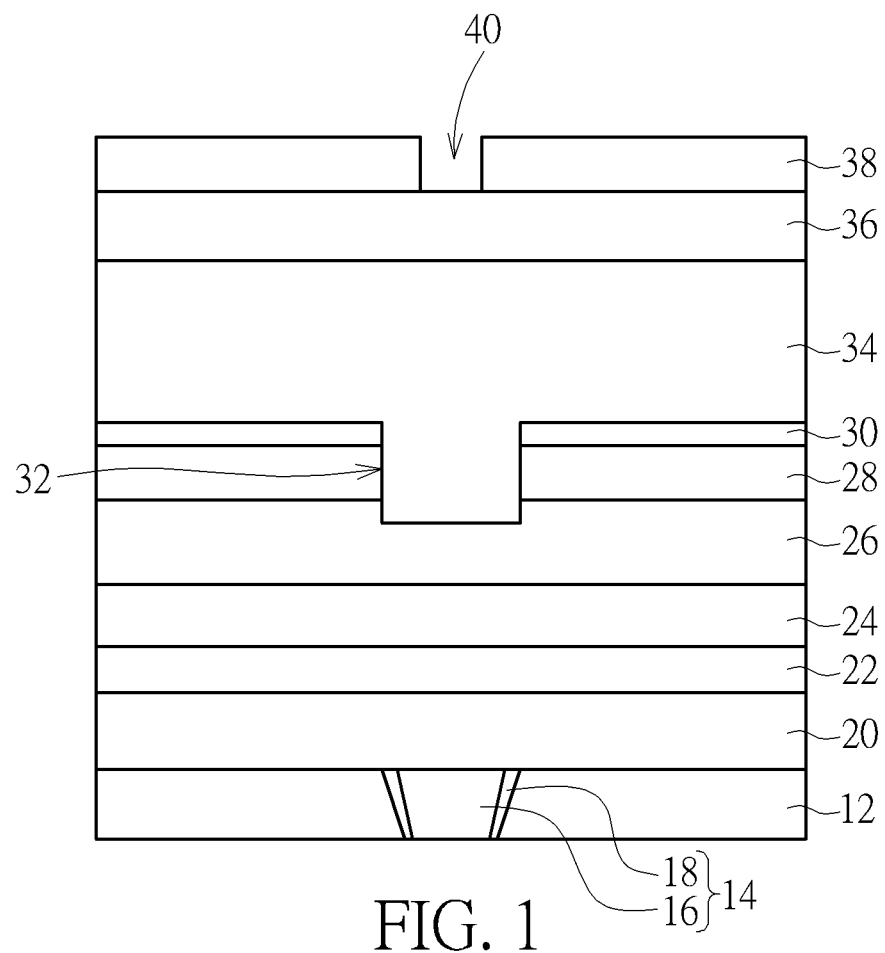
FIGS. 1-5 illustrate a method for fabricating a semiconductor device according to an embodiment of the present invention.

Referring to FIGS. 1-5, FIGS. 1-5 illustrate a method for fabricating a semiconductor device according to an embodiment of the present invention. As shown in FIG. 1, a substrate (not shown) is provided, in which the substrate could be composed of monocrystalline silicon, gallium arsenide (GaAs) or other known semiconductor material. The substrate could also include fin-shaped structures and shallow trench isolation structures (STIs) surrounding the fin-shaped structures. A standard metal-oxide semiconductor (MOS) transistor fabrication could be performed to form at least one MOS transistor (not shown) or other semiconductor devices on the substrate, in which the MOS transistor could be a PMOS transistor, NMOS transistor, or CMOS transistor, and the MOS transistor could also include typical transistor structures including metal gate, spacer, source/drain regions, epitaxial layers, and/or silicides.

After forming the MOS transistor on the substrate, elements such as an interlayer dielectric (ILD) layer is covered on the substrate and the MOS transistor and contact plugs are formed in the ILD layer to electrically connect the MOS transistor. Next, a first dielectric layer such as an inter-metal dielectric (IMD) layer 12 is formed on the ILD layer and a metal layer 14 is formed in the IMD layer 12. Preferably, the metal layer 14 could be a metal line or metal interconnection including a trench conductor 16 or via conductor with a barrier layer 18 around the trench conductor 16, in which the metal line could be fabricated through a metal interconnective or damascene process.

Next, a second dielectric layer 20 is formed on the first dielectric layer or IMD layer 12 and the metal layer 14, and another dielectric layer 22 and a metal oxide layer 24 are formed on the second dielectric layer 20 thereafter. Preferably, the second dielectric layer 20 is made of dielectric material including but not limited to for example silicon nitride, the dielectric layer 22 is made of material including but not limited to for example silicon oxide, and the metal oxide layer 24 is made of material including but not limited to for example aluminum oxide ($AlO_x$).

Next, a third dielectric layer 26 is formed on the metal oxide layer, a hard mask 28 is formed on the third dielectric layer 26, and anther dielectric layer 30 is formed on the hard mask 28. In this embodiment, the third dielectric layer 26 and dielectric layer 30 are made of material including but not limited to for example silicon oxide and the hard mask 28 is made of material including but not limited to for example titanium nitride (TiN). Next, a photo-etching process is conducted to remove part of the dielectric layer 30, part of the hard mask 28, and part of the third dielectric layer 26 to form a trench opening 32.

Next, a try-layer structure preferably including an organic dielectric layer (ODL) 34, a silicon-containing hard mask bottom anti-reflective coating (SHB) 36, and a patterned resist 38 are sequentially formed on the dielectric layer 30 to cover the trench opening 32, in which the patterned resist 38 includes an opening 40 exposing a top surface of the SHB 36 and defining the size of a via opening formed afterwards.

Figure 2:
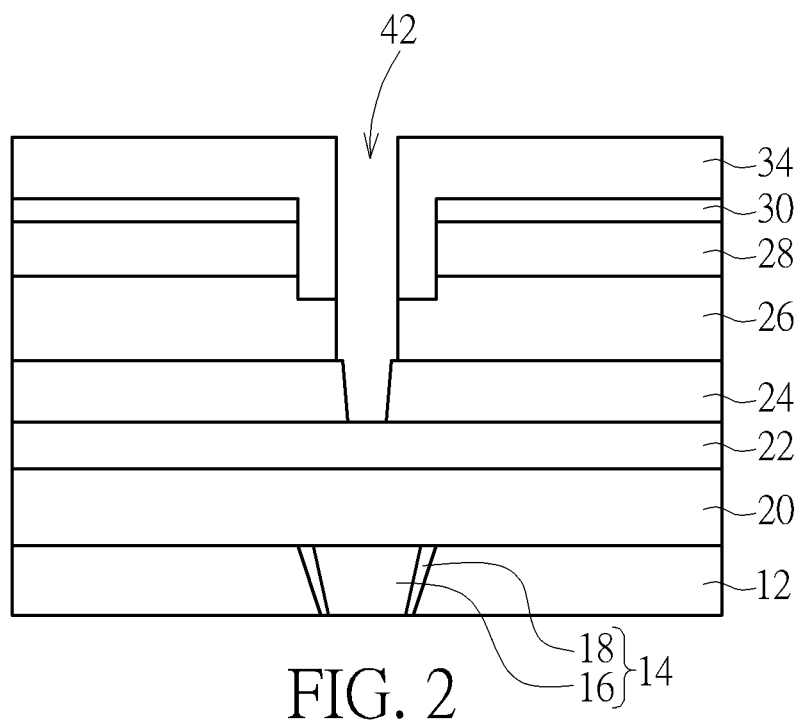

Next, as shown in FIG. 2, a first etching process is conducted by using a chlorine-based etchant to remove part of the metal oxide layer 24 to form a via opening 42. Specifically, the first etching process could be accomplished by conducting one or more etching processes to transfer the pattern of the opening 40 to the SHB 36 and the ODL 34 underneath. For example, the patterned resist 38 is first used as a mask to remove part of the SHB 36 and part of the ODL 34. After removing the patterned resist 38 and the SHB 36, the ODL 34 is used as mask to remove part of the third dielectric layer 26 and part of the metal oxide layer 24 to form the via opening 42. In this embodiment, the chlorine-based etchant used to form the via opening 42 preferably includes $Cl_2$, $BCl_3$, or combination thereof.

Figure 3:
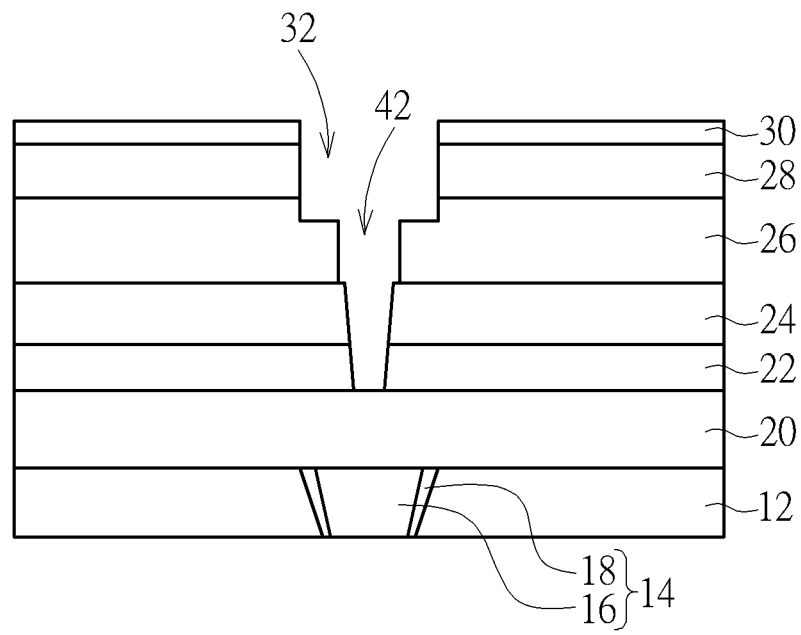

Next, as shown in FIG. 3, the first etching process is further continued by using the ODL 34 as mask to remove part of the dielectric layer 22 and expose the surface of the second dielectric layer 20. Similar to the etching process conducted in FIG. 2, the etching process conducted at this stage for removing part of the dielectric layer 22 is accomplished by a chlorine-based etchant such as $Cl_2$, $BCl_3$, or combination thereof. After the via opening 42 is further extended downward by the etching process to expose the surface of the second dielectric layer 20 underneath, the ODL 34 could be removed by an ashing process.

Figure 4:
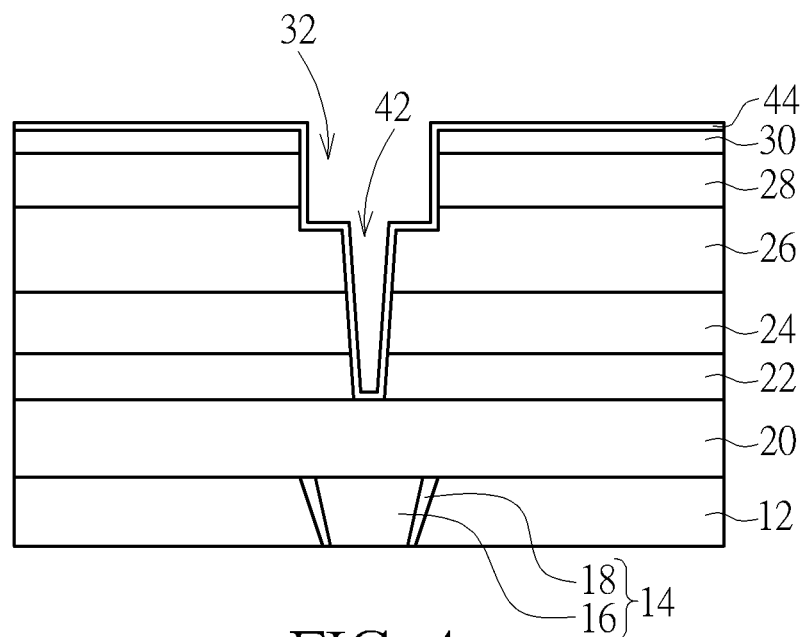

Next, as shown in FIG. 4, a block layer 44 is formed conformally on sidewalls of the dielectric layer 22, the metal oxide layer 24, the third dielectric layer 26, the hard mask 28, and the dielectric layer 30 as well as a top surface of the dielectric layer 30 and a top surface of the third dielectric layer 26 while not filling the trench opening 32 and the via opening 42 completely. Preferably, the block layer 44 and the second dielectric layer 20 are made of same material such as silicon nitride, but not limited thereto.

Figure 5:
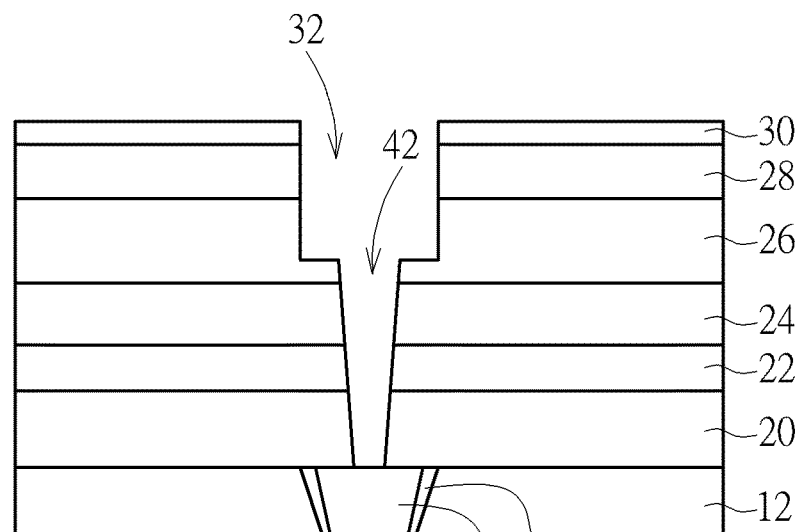

Next, as shown in FIG. 5, a second etching process is conducted by using a fluorine-based etchant to remove the block layer 44, part of the third dielectric layer 26, and part of the second dielectric layer 20 to expose a top surface of the metal layer 14 embedded in the IMD layer 12. It should be noted that since the sidewalls of the metal oxide layer 24 is protected by the block layer 44, none of the metal oxide layer 24 would be lost or damaged by the fluorine-based etchant during the etching process.

In addition, even though the block layer 44 is etched away in this embodiment, according to an embodiment of the present invention, it would also be desirable to not removing any or only part of the block layer 44 during the removal of the second dielectric layer 20 so that at least part of the block layer 44 still remains on the sidewalls of the dielectric layer 22, the metal oxide layer 24, the third dielectric layer 26, the hard mask 28, and the dielectric layer 30 as well as the top surface of the dielectric layer 30, which is also within the scope of the present invention. In this embodiment, the fluorine-based etchant used to extend the via opening 42 downward to expose the metal layer preferably includes $CF_4$, but not limited thereto.

Figure 6:
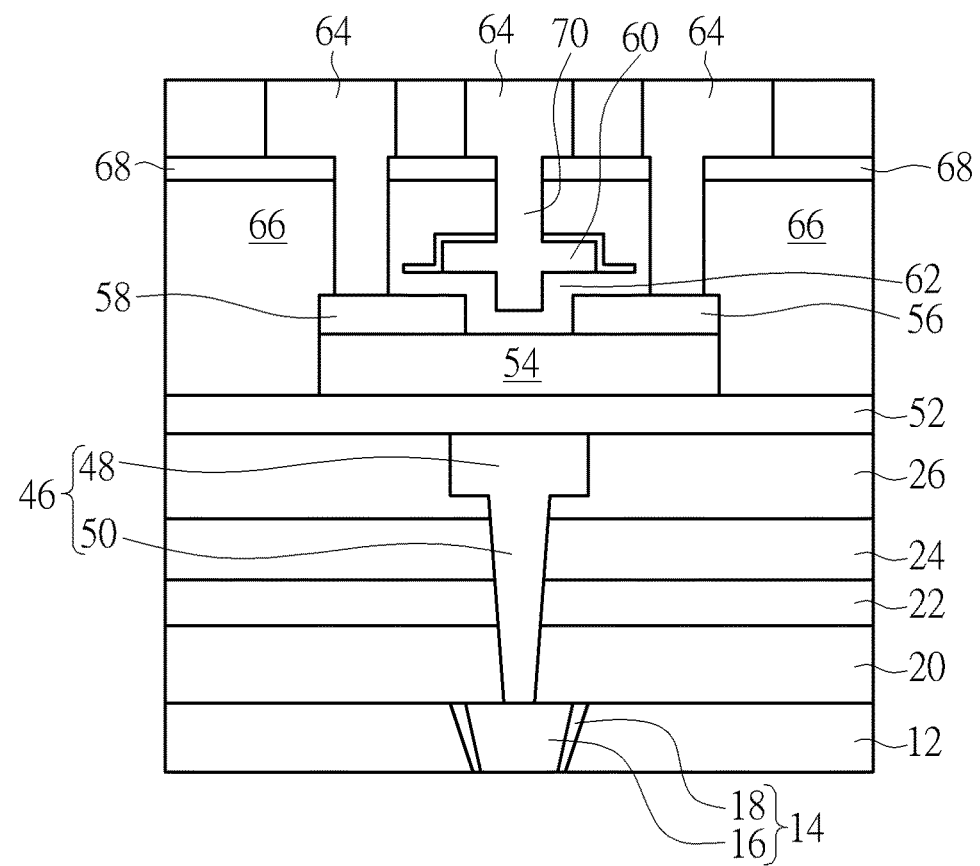
FIG. 6 illustrates a structural view of an OSFET having a back gate fabricated from processes shown in FIGS. 1-5.

After the via opening 42 is extended downward to expose the surface of the metal layer 14, as shown in FIG. 6, conductive materials or more specifically metals could be deposited into the trench opening 32 and the via opening 42, and a planarizing process such as chemical mechanical polishing (CMP) process is conducted to remove part of the conductive material, the dielectric layer 30, and the hard mask for forming a metal interconnection 46, in which the metal interconnection 46 includes a trench conductor 48 and a via conductor 50.

According to an embodiment of the present invention, the metal interconnection 46 could be serving as a back gate of an oxide semiconductor field effect transistor (OSFET). Referring again to FIG. 6, which illustrates a structural view of an OSFET having back gate fabricated from processes shown in FIGS. 1-5. As shown in FIG. 6, after the back gate 46 is fabricated, an OSFET could be formed on top of the back gate 46 or metal interconnection and the dielectric layers around the back gate 46.

Specifically, the OSFET includes a back gate insulator 52 disposed on the back gate 46, a channel layer 54 disposed on the back gate insulator 52, a source layer 56 and a drain layer 58 on the channel layer 54, a top gate 60 on the channel layer 54, a gate dielectric layer 62 between the top gate 60 and the channel layer 54, and contact plugs 64 electrically connecting the top gate 60, the source layer 56 and the drain layer 58, and a dielectric layer 66 surrounding the OSFET.

According to an embodiment of the present invention, a via conductor 70 connecting the top gate 60 and the contact plug 64 could also be fabricated by the same approach as disclosed in FIGS. 1-5 and in such instance, a similar metal oxide layer 68 could be formed on the dielectric layer 66, a block layer (not shown) could be formed on the sidewalls of the metal oxide layer 68 after trench opening and via opening are formed, a fluorine-based etchant is used to remove part of the dielectric layer 66 to expose the top gate 60, and conductive material or metals are deposited to form the via conductor 70. Since the metal oxide layer 68 is protected by the block layer (not shown) during the etching process, none of the metal oxide layer 68 would be lost or damaged by the fluorine-based etchant.

In this embodiment, the channel layer 54 or OS layer is preferably selected from the group consisting of indium gallium zinc oxide (IGZO), indium aluminum zinc oxide, indium tin zinc oxide, indium aluminum gallium zinc oxide, indium tin aluminum zinc oxide, indium tin hafnium zinc oxide, and indium hafnium aluminum zinc oxide, and the hard mask 26 could be selected from dielectric material consisting of silicon oxide, silicon nitride, SiON, and SiCN, but not limited thereto.

The back gate 46, the source layer 56, the drain layer 58, and the top gate 60 could be made of same material, but could also be made of different material depending on the demand of the product. In this embodiment, back gate 46, the source layer 56, the drain layer 58, and the top gate 60 are preferably made of element selected from Al, Cr, Cu, Ta, TaN, Ti, TiN, Mo, W, an alloy containing any of these elements as a component, or combination thereof. Furthermore, one or more materials selected from Mn, Mg, Zr, Be, and Th may be used. Aluminum combined with one or more of elements selected from Ti, Ta, W, Mo, Cr, Nd, and Sc may be used.

The gate dielectric layer 62 is preferably made of silicon oxide. According to an embodiment of the present invention, the gate dielectric layer 62 could also include a high-k dielectric layer selected from dielectric materials having dielectric constant (k value) larger than 4. For instance, the high-k dielectric layer may be selected from hafnium oxide ($HfO_2$), hafnium silicon oxide ($HfSiO_4$), hafnium silicon oxynitride (HfSiON), aluminum oxide ($Al_2O_3$), lanthanum oxide ($La_2O_3$), tantalum oxide ($Ta_2O_5$), yttrium oxide ($Y_2O_3$), zirconium oxide ($ZrO_2$), strontium titanate oxide ($SrTiO_3$), zirconium silicon oxide ($ZrSiO_4$), hafnium zirconium oxide ($HfZrO_4$), strontium bismuth tantalate ($SrBi_2Ta_2O_9$, SBT), lead zirconate titanate ($PbZr_xTi_{1-x}O_3$, PZT), barium strontium titanate ($Ba_xSr_{1-x}TiO_3$, BST) or a combination thereof.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for fabricating a semiconductor device, comprising:
    providing a first dielectric layer having a metal layer therein;
    forming a second dielectric layer on the first dielectric layer and the metal layer;
    forming a metal oxide layer on the second dielectric layer;
    performing a first etching process by using a chlorine-based etchant to remove part of the metal oxide layer to form a via opening and expose the second dielectric layer;
    forming a block layer on sidewalls of the metal oxide layer and a top surface of the second dielectric layer; and
    performing a second etching process by using a fluorine-based etchant to remove part of the block layer and part of the second dielectric layer for exposing a top surface of the metal layer and the sidewalls of the metal oxide layer without removing any of the metal oxide layer.

2. The method of claim 1, further comprising:
    forming a third dielectric layer on the metal oxide layer;
    forming a hard mask on the third dielectric layer;
    forming a trench opening in the hard mask; and
    performing the first etching process to remove part of the third dielectric layer and part of the metal oxide layer for forming the via opening.

3. The method of claim 2, wherein the third dielectric layer comprises silicon oxide.

4. The method of claim 2, wherein the hard mask comprises TiN.

5. The method of claim 1, further comprising forming a conductive layer in the trench opening and the via opening after performing the second etching process.

6. The method of claim 1, wherein the second dielectric layer and the block layer comprise same material.

7. The method of claim 6, wherein the second dielectric layer and the block layer comprise silicon nitride.

8. The method of claim 1, wherein the metal oxide layer comprises $AlO_x$.

9. The method of claim 1, wherein the chlorine-based etchant comprises $Cl_2$ or $BCl_3$.

10. The method of claim 1, wherein the fluorine-based etchant comprises $CF_4$.

11. A method for fabricating a semiconductor device, comprising:
    providing a first dielectric layer having a metal layer therein;
    forming a second dielectric layer on the first dielectric layer and the metal layer;
    forming a metal oxide layer on the second dielectric layer;
    performing a first etching process by using a chlorine-based etchant to remove part of the metal oxide layer to form a via opening and expose the second dielectric layer;
    forming a block layer on sidewalls of the metal oxide layer and a top surface of the second dielectric layer; and
    performing a second etching process by using a fluorine-based etchant to remove all of the block layer and part of the second dielectric layer for exposing a top surface of the metal layer.

* * * * *